(12) United States Patent
Mangano et al.

(10) Patent No.: US 11,803,226 B2
(45) Date of Patent: Oct. 31, 2023

(54) METHODS AND DEVICES TO CONSERVE MICROCONTROLLER POWER

(71) Applicant: STMicroelectronics S.r.l., Agrate Brianza (IT)

(72) Inventors: Daniele Mangano, San Gregorio di Catania (IT); Michele Alessandro Carrano, Catania (IT); Pasquale Butta', Messina (IT); Sergio Abenda, Tremestieri Etneo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 331 days.

(21) Appl. No.: 16/874,020

(22) Filed: May 14, 2020

(65) Prior Publication Data

US 2021/0357015 A1  Nov. 18, 2021

(51) Int. Cl.
*G06F 1/3234* (2019.01)
*H03K 3/037* (2006.01)
*G06F 1/3296* (2019.01)

(52) U.S. Cl.
CPC ............ *G06F 1/325* (2013.01); *G06F 1/3243* (2013.01); *H03K 3/037* (2013.01)

(58) Field of Classification Search
CPC ........ G06F 1/325; G06F 1/3243; H03K 3/037
See application file for complete search history.

(56) References Cited

U.S. PATENT DOCUMENTS

| | | | |
|---|---|---|---|
| 7,639,056 B2 | 12/2009 | Gururajarao et al. | |
| 9,058,126 B2 | 6/2015 | Bartling et al. | |
| 10,102,889 B2 * | 10/2018 | Bartling | G06F 11/1438 |
| 2005/0218943 A1 * | 10/2005 | Padhye | G06F 1/3203 |
| | | | 327/109 |
| 2008/0315931 A1 * | 12/2008 | Maeda | H03K 19/0016 |
| | | | 327/198 |
| 2010/0308876 A1 * | 12/2010 | Kawasaki | G06F 1/3275 |
| | | | 327/143 |
| 2014/0351615 A1 * | 11/2014 | Gupta | H03K 19/0016 |
| | | | 713/323 |
| 2016/0004292 A1 * | 1/2016 | Sharda | G06F 13/4022 |
| | | | 710/317 |
| 2018/0082755 A1 * | 3/2018 | Kunie | G11C 29/1201 |
| 2018/0159513 A1 * | 6/2018 | Reddy | H03K 3/356008 |
| 2018/0224921 A1 * | 8/2018 | Pant | G06F 1/10 |
| 2019/0384339 A1 * | 12/2019 | Pelicia | G05F 1/56 |

\* cited by examiner

*Primary Examiner* — Jaweed A Abbaszadeh
*Assistant Examiner* — Gayathri Sampath
(74) *Attorney, Agent, or Firm* — Slater Matsil, LLP

(57) ABSTRACT

A power-saving system includes a retention memory element for a retained peripheral that is set to a logic state during an operational-power mode and maintains the logic state during an enhanced power-saving mode. The power-saving system also includes a non-retention memory element for a non-retained peripheral that is set to a logic state during the operational-power mode of the power-saving system; and a controller that instructs the retention memory element to maintain its logic state while in an enhanced power-saving mode.

25 Claims, 10 Drawing Sheets

METHODS AND DEVICES TO CONSERVE MICROCONTROLLER POWER

TECHNICAL FIELD

This application relates to microcontrollers, and in particular to methods and devices to conserve power for a microcontroller.

BACKGROUND

Microcontroller operations may undesirably consume power resources during periods of inactivity or low usage. Undesirable power consumption can be limited during periods of inactivity or low use by reducing the power supply to internal peripherals that may consume power while in a low-power mode. Many microcontrollers can switch into one or more low power modes to attempt to conserve power. But, tradeoffs exist between power-consumption reduction, user experience, and application complexity.

SUMMARY

In accordance with an embodiment of the present invention a power-saving system includes a retention flip flop of a retained peripheral and a non-retention flip flop of a non-retained peripheral. The power-saving system further includes a controller in communication with the retention flip flop and the non-retention flip flop, wherein the controller is configured to deliver a save signal to the retention flip flop to instruct the retention flip flop to maintain a logic state of the retained peripheral during an enhanced power-saving mode of the power-saving system and to deliver a reset signal to the non-retention flip flop to instruct the non-retention flip flop to reset the non-retention flip flop when the power-saving system enters the enhanced power-saving mode of the power-saving system.

In accordance with an embodiment of the present invention, microcontroller includes a main-power regulator coupled to a principal voltage supply and configured to provide a main power, a low-power regulator coupled to the principal voltage supply and configured to provide a low power, a first switching arrangement configured to couple and decouple the main-power regulator to a retention flip flop and a non-retention flip flop; and a second switching arrangement configured to couple and decouple the low-power regulator to the retention flip flop. The microcontroller further includes a power-mode controller in communication with the first switching arrangement and the second switching arrangement and configured to operate the first switching arrangement to couple the main-power regulator to the retention flip flop and the non-retention flip flop during an operational-power mode; and wherein the power-mode controller is configured to operate the second switching arrangement to couple the low-power regulator to the retention flip flop during an enhanced power-saving mode and operate the first switching arrangement to decouple the retention flip flop and the non-retention flip flop from the main-power regulator during the enhanced power-saving mode.

In accordance with an embodiment of the present invention a method to conserve power includes having a microcontroller; setting a retention flip flop to a logic state of a retained peripheral during an operational-power mode; setting a non-retention flip flop to a logic state of a non-retained peripheral during the operational-power mode; decoupling a main power source from the retention flip flop and the non-retention flip flop during an enhanced power-saving mode; and providing a low-power source to the retention flip flop to maintain the logic state of the retained peripheral in a low-power location of the retention flip flop during the enhanced power-saving mode.

BRIEF DESCRIPTION OF THE DRAWINGS

One or more embodiments will now be described, by way of example only, with reference to the annexed figures, wherein.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

Excess power consumption is undesirable in many electronic devices. Designers may attempt to reduce power consumption. Microcontrollers may limit power consumption with one or more low-power modes that may be entered during periods of inactivity.

Figure 1:
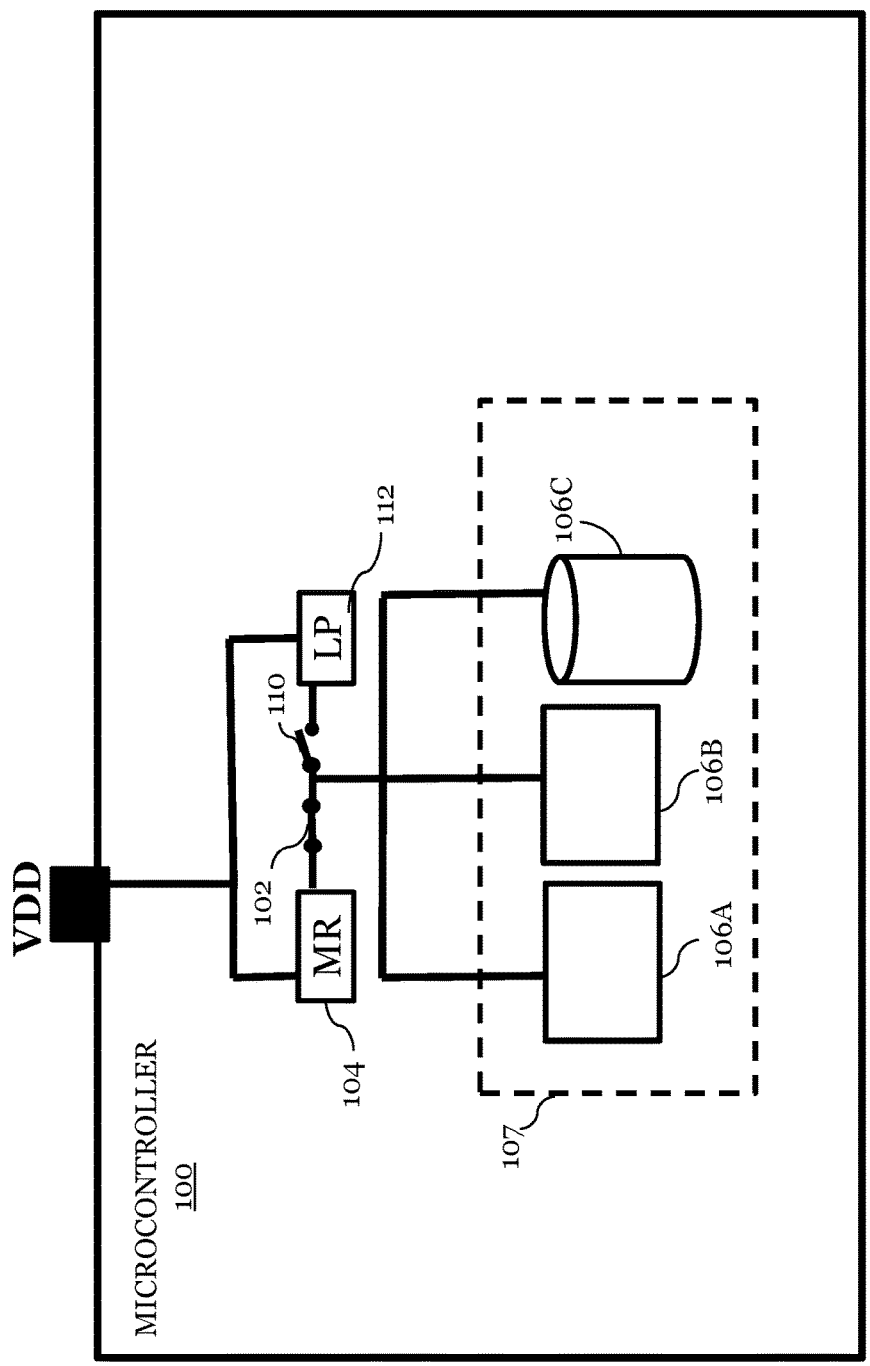
FIG. 1 illustrates a block-figure diagram of a microcontroller with a power-saving system in an operational-power mode.

FIG. 1 illustrates a block-figure diagram of a microcontroller with a power-saving system in an operational-power mode.

The microcontroller 100 has two modes of operation. During a standard operation, a first switch 102 is closed. Power is provided to a variety of components of the microcontroller 100 by a main regulator 104 when the first switch 102 is closed.

The main regulator 104 is coupled to a voltage source that provides supply voltage $V_{DD}$. During a standard power mode, the main regulator 104 disseminates enough power to the components of the microcontroller 100 to allow them to operate.

During periods of inactivity or low usage, the microcontroller 100 limits the power supply to some components or internal peripherals.

Figure 2:
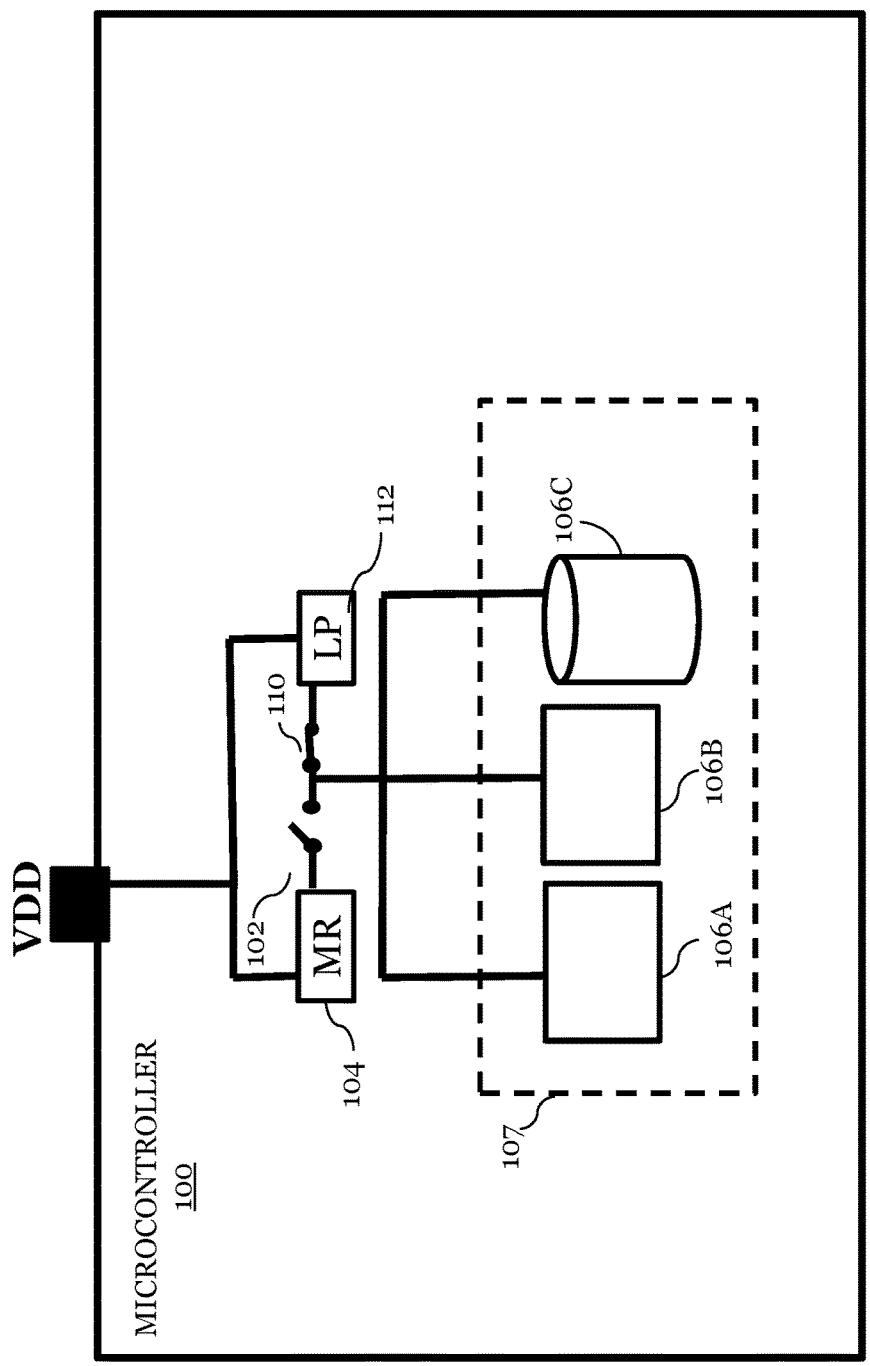
FIG. 2 illustrates a block-figure diagram of a microcontroller with a power-saving system in a low-power mode.

FIG. 2 illustrates a block-figure diagram of a microcontroller with a power-saving system in a low-power mode. This low-power mode is referred herein as a stop mode.

In the stop mode, a second switch 110 couples a low-power regulator 112 to some peripherals of microcontroller 100 to supply a low power to the peripherals. A first switch 102 decouples the main regulator 104 from the peripherals. The power supplied by the low-power regulator 112 is less than the amount of power supplied by the main regulator 104 during the operational-power mode. This allows power savings for the microcontroller 100 when it is in a stop mode.

The microcontroller 100 includes a first retained peripheral 106A, a second retained peripheral 106B and a third retained peripheral 106C. Logic states of the first retained peripheral 106A are stored in flip flops or other volatile memory elements of the first retained peripheral 106A. Logic states of the second retained peripheral 106B are stored in flip flops or other volatile memory element of the second retained peripheral 106B. Logic states of the third retained peripheral 106C are stored in flip flops or other volatile memory element of the third retained peripheral 106C.

The logic states of the first retained peripheral 106A, second retained peripheral 106B, and third retained peripheral 106C may be maintained during a stop mode. The retained peripherals may be grouped into a retained-peripheral domain 107. The power supplied by the low-power regulator 112 may provide enough power to save the logic states of the first retained peripheral 106A, second retained peripheral 106B, and third retained peripheral 106C while the microcontroller 100 is in the stop mode.

Figure 3:
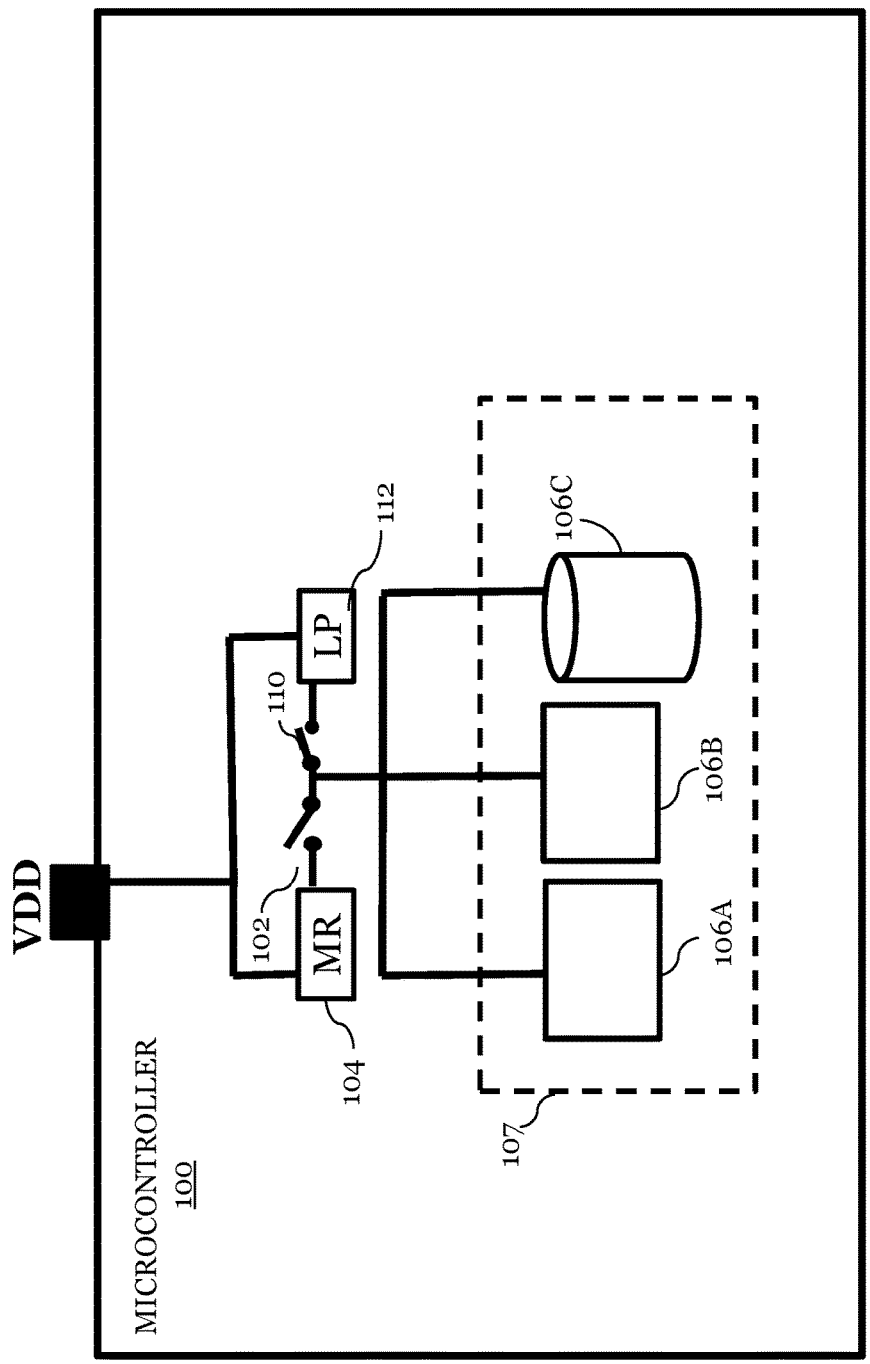
FIG. 3 illustrates a block-figure diagram of a microcontroller with a power-saving system in a low-power mode.

FIG. 3 shows a block-figure diagram of a microcontroller with a power-saving system in a low-power mode.

This mode may be referred to as a standby mode. In various embodiments, the first switch 102 may be open when in standby mode. This may decouple the main regulator 104 from the first retained peripheral 106A, second retained peripheral 106B, and third retained peripheral 106C. The second switch 110 may also be open in the standby mode. And, the low-power regulator 112 may be decoupled from the first retained peripheral 106A, second retained peripheral 106B, and third retained peripheral 106C. Isolated from the main regulator 104 and the low-power regulator 112, the first retained peripheral 106A, second retained peripheral 106B, and third retained peripheral 106C may have no power supply during standby mode and may consume little or no power.

This may cause the flip flops or other volatile memory elements storing the digital logic state of the first retained peripheral 106A, second retained peripheral 106B, and third retained peripheral 106C to lose their digital logic setting. And, the state of the first retained peripheral 106A, second retained peripheral 106B, and third retained peripheral 106C may also be lost along with the digital logic settings of their associated flip flops or other memory elements.

When exiting the standby mode, the first retained peripheral 106A, second retained peripheral 106B, and third retained peripheral 106C of microcontroller 100 may initialization. And, it may take more time to transition the microcontroller 100 from a standby mode back to an operational-power mode than may be desirable in some circumstances. From a user perspective, exiting the standby mode and re-entering the operational-power mode, which may be called a wakeup, may appear like a system reboot.

In various embodiments, a microcontroller with an enhanced power-saving mode allows more reduction in power consumption and limits user disruption, software complexities, and transition times between power modes.

Figure 4:
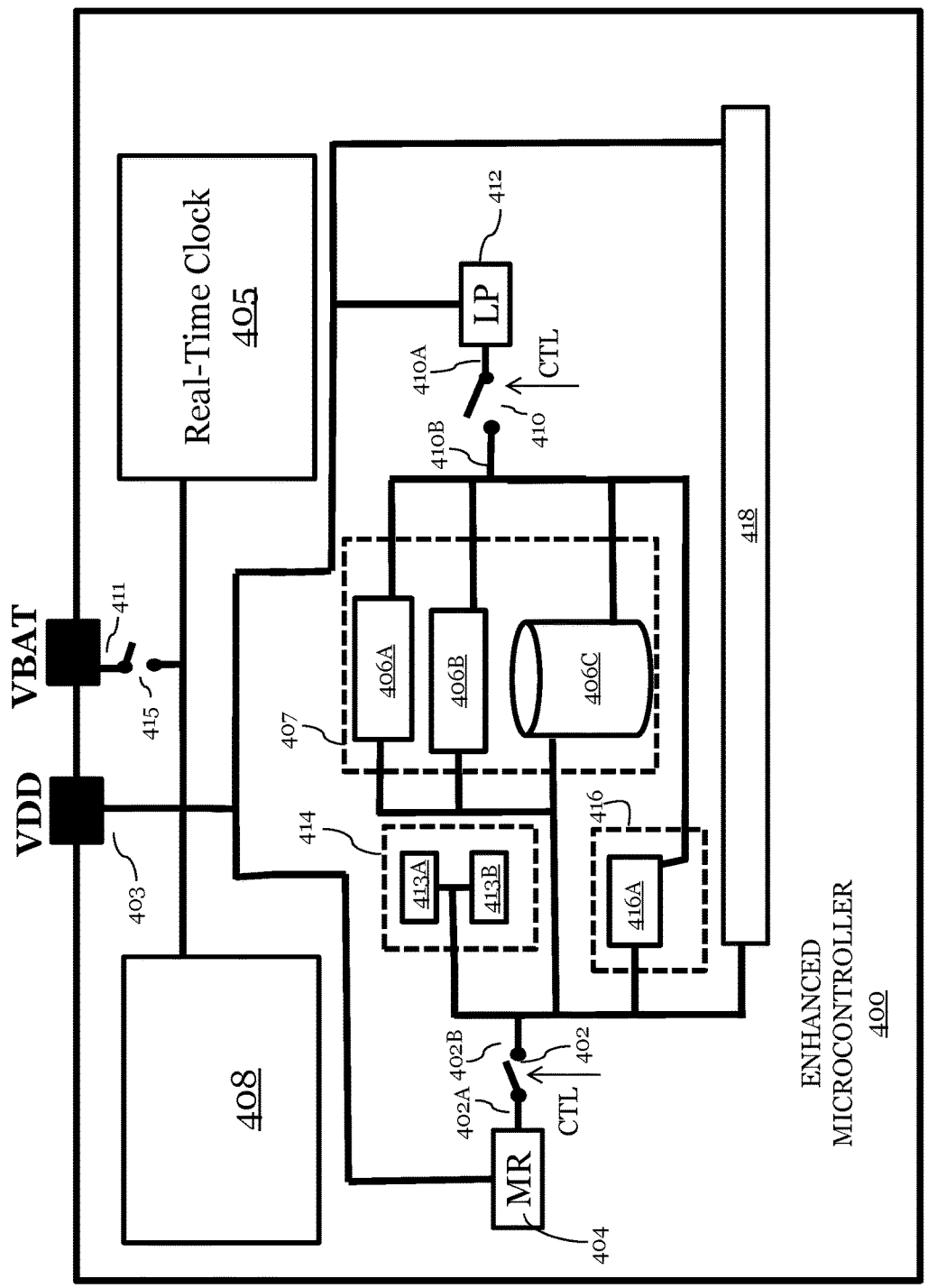
FIG. 4 illustrates an embodiment of an enhanced microcontroller.

FIG. 4 illustrates an embodiment of an enhanced microcontroller 400.

In various embodiments, the enhanced microcontroller 400 may comprise a voltage input 403 to receive a supply voltage $V_{DD}$. The supply voltage $V_{DD}$ may be delivered directly or indirectly to components of the enhanced microcontroller 400. The supply voltage $V_{DD}$ may comprise an external voltage supply in various embodiments. In various embodiments, $V_{DD}$ may be 3 volts. But, $V_{DD}$ may comprise a larger or smaller voltage in other embodiments.

In various embodiments, the enhanced microcontroller 400 may comprise components or peripherals that are not subject to power-reductions of an enhanced-power saving mode. Peripherals that are not subject to the power-reductions of an enhanced-power saving mode may continue to receive the same amount of power, or substantially the same amount, when the enhanced microcontroller 400 is in a power-saving mode. In various embodiments, this may include any peripherals or components that may need to operate at full power to keep the microcontroller running, initialize a wake-up routine, or both. Some embodiments of peripherals that are not subject to power-reductions of the enhanced-power saving mode may be directly coupled $V_{DD}$.

In various embodiments, the enhanced microcontroller 400 may comprise a real-time clock 405. The real-time clock 405 is subject to power-reductions of the enhanced-power saving mode in various embodiments.

In various embodiments, the real-time clock 405 may be coupled with $V_{DD}$ so the real-time clock 405 continues to receive full power and continues to operate during various embodiments of the enhanced power-saving mode.

In various embodiments, the enhanced microcontroller 400 may comprise an additional full-power peripheral 408 that may not be subject to power-reductions of the enhanced-power saving mode. In some embodiments, the additional full-power peripheral 408 may comprise an independent watchdog.

In various embodiments, the additional full-power peripheral 408 may be coupled with $V_{DD}$ so the additional full-power peripheral 408 continues to receive full power and operate during various embodiments of the enhanced power-saving mode. In various embodiments, the enhanced microcontroller 400 may comprise one or more additional peripherals that are not subject to power-reductions of the enhanced-power saving mode.

In various embodiments, the enhanced microcontroller 400 may comprise an additional voltage supply input 411 to receive a secondary voltage source. The secondary voltage source received at the additional voltage supply input 411 may comprise, in one embodiment, a battery outputting a battery voltage $V_{BAT}$. In various embodiments, the enhanced microcontroller 400 may comprise a battery where the additional voltage is stored. In some embodiments, the battery supplying the voltage $V_{BAT}$ may provide a backup voltage supply for the enhanced microcontroller 400.

The enhanced microcontroller 400 may comprise a backup voltage supply switch 415 that may be open when the main supply $V_{DD}$ is present and closed when the main supply $V_{DD}$ is not present. In various embodiments, the battery supplying voltage $V_{BAT}$ may provide backup voltage for the real-time clock 405 or backup registers, or both. The backup voltage supply $V_{BAT}$ provided by the battery may be needed if the external voltage supply providing the supply voltage $V_{DD}$ is removed.

In various embodiments, the enhanced microcontroller 400 may comprise a main regulator 404 and a low-power regulator 412. The low-power regulator 412 may comprise a step-down regulator. The enhanced microcontroller 400 may also comprise a first switching arrangement 402 and second switching arrangement 410.

In various embodiments, the first switching arrangement 402 may comprise a single switch. The first switching arrangement 402 may comprise two or more switches. In various embodiments, the second switching arrangement 410 may comprise a single switch. In various embodiments, the second switching arrangement 410 may comprise two or more switches.

In various embodiments, the first switching arrangement 402 may comprise a first end 402A coupled to main regulator 404, a second end 402B coupled to one or more retention memory elements 500, and a second end coupled to one or more non-retention memory elements 506. The retention memory element 500 and non-retention memory element 506 are discussed elsewhere in this disclosure at least with reference to FIG. 5. In various embodiments, the second switching arrangement 410 may comprise a first end 410A coupled to the low-power regulator 412 and a second end 410B coupled to one or more retention memory elements 500.

In various embodiments, an enhanced microcontroller 400 may comprise one or more retained peripherals. A retained peripheral may comprise any internal peripheral of the enhanced microcontroller 400 that is disconnected from a high power supply and connected to a low-power supply during an enhanced power-saving mode. This may allow the logic state of a retained peripheral to be saved during the enhanced low-power mode with less power consumption. The logic states of retained peripherals may be retained by storing their states in a retained memory element or flip flop that receives power from a low-power source during the enhanced power-saving mode.

For descriptive purposes, the retained peripherals may be grouped into a retained-peripheral domain 407. In various embodiments, the retained peripherals of the retained-peripheral domain 407 may be physically grouped together in an enhanced microcontroller 400. In various embodiments, the retained peripherals of the retained-peripheral domain 407 are not physically grouped together in the enhanced microcontroller 400.

In various embodiments, a CPU 406A may be in the retained-peripheral domain 407. In various embodiments, an SRAM 406C may be in the retained-peripheral domain 407. In various embodiments, the retained-peripheral domain 407 may include an additional retained peripheral 406B. The retained-peripheral domain 407 may comprise a plurality of additional retained-peripherals or less retained peripherals.

In various embodiments, an enhanced microcontroller 400 may comprise one or more non-retained peripherals. A non-retained peripheral may comprise any peripheral that loses its power supply during an enhanced power-saving mode. For descriptive purposes, the non-retained peripherals may be grouped into a non-retained peripheral domain 414. In various embodiments, the non-retained peripherals of the non-retained peripheral domain 414 may be physically grouped together in the enhanced microcontroller 400. In various embodiments, the non-retained peripherals of the non-retained peripheral domain 414 are not physically grouped together in the enhanced microcontroller 400. The non-retained peripheral domain 414 may include a first retained peripheral 413A and a second retained peripheral 413B. In various embodiments, the non-retained peripheral domain 414 may include more or less non-retained peripherals.

During an operational-power mode of the enhanced microcontroller 400, the first switching arrangement 402 may be closed. When the first switching arrangement 402 is closed, the retention peripherals may be coupled with the main regulator 404. The main regulator 404 may be coupled to a voltage source providing $V_{DD}$. When the first switching arrangement 402 is closed, the main regulator 404 may provide a high-power source for the retained peripherals of the retained-peripheral domain 407.

In various embodiments, the main regulator 404 may be coupled with battery voltage $V_{BAT}$ if supply voltage $V_{DD}$ is not present. $V_{DD}$ may serve as the principal voltage supply of an enhanced microcontroller 400 and $V_{BAT}$ as a backup voltage supply. When $V_{DD}$ is not present or disconnected from an enhanced microcontroller 400, the battery voltage $V_{BAT}$ from the battery may serve as the principal voltage source of an enhanced microcontroller 400. The main regulator 404 may be configured to receive a voltage from the principal voltage source.

When the first switching arrangement 402 is closed, the non-retained peripherals of the non-retained peripheral domain 414 may also be coupled with the main regulator 404, which may serve as a high-power source for the non-retained peripherals of the non-retained peripheral domain 414. During the operational-power mode, the retained peripherals of the retained-peripheral domain 407 are allocated enough power for full operation. This may include the CPU 406A, SRAM 406C, the additional retained peripherals 406B, and any additional retained peripherals of the retained-peripheral domain 107. During the operational-power mode, the non-retained peripherals of the non-retained peripheral domain 414 may also allocated enough power for full operation.

An enhanced power-saving mode of an enhanced microcontroller 400 may allow the enhanced microcontroller 400 to save power. In various embodiments, the first switching arrangement 402 may be open in the enhanced power-saving mode of an enhanced microcontroller 400. This may isolate the retained peripherals of the retained-peripheral domain 407 and the non-retained peripherals of the non-retained peripheral domain 414 from the high-power source provided by the main regulator 404.

In various embodiments, the main regulator 404 may be turned off when it is not being used. For example, there may be embodiments where the main regulator 404 is not used in an enhanced power-saving mode of an enhanced microcontroller 400, and the main regulator 404 may be turned off during such an enhanced power-saving mode. The main regulator 404 may be turned on and off by internal circuitry or a switch not depicted in FIG. 4.

In various embodiments, the low-power regulator 412 may be turned off when it is not being used. For example, there may be embodiments where the low-power regulator 412 is not used in an operational-power mode of an enhanced microcontroller 400, and the low-power regulator 412 may be off during such an operational-power mode. The low-power regulator 412 may be turned on and off by internal circuitry or a switch not depicted in FIG. 4.

In the enhanced power-saving mode of an enhanced microcontroller 400, the second switching arrangement 410 may be closed so as to couple the low-power regulator 412 of an enhanced microcontroller 400 with the retained peripherals of the retained-peripheral domain 407. The low-power regulator 412 may be configured to receive voltage from the principal voltage source to provide a low power. When the second switching arrangement 410 is closed, the low-power regulator 412 may provide a low power to the retained-peripheral domain 407. In various embodiments, the low-power regulator 412 may provide 1.2 V. The low-power regulator 412 may provide more or less than 1.2 V but less than the supply voltage $V_{DD}$.

The low-power provided by the low power regulator in the enhanced power-saving mode, may provide enough power to retain (e.g., in volatile memory) the logic states of the retained peripherals of the retained-peripheral domain 407. But, in various embodiments, the low-power may not provide enough power for the retained peripherals of the retained peripheral domain to perform standard operations. This allows a reduced power consumption because less power may be needed to retain the logic state of the retained peripherals of the retained-peripheral domain 407 than to perform standard operations.

During the enhanced power-saving mode, the non-retained peripherals of the non-retained peripheral domain 414 may be isolated from the main regulator 404 and a power source. Power may be saved because the non-retained peripherals of the non-retained peripheral domain 414 will not consume power when they are isolated from the main regulator 404.

An enhanced microcontroller 400 with an enhanced-power saving mode may provide many advantages. The enhanced-power saving mode may allow more flexibility than a stop mode or a standby mode. It may conserve more power than a stop mode because less peripherals may be retained. It may also enhance user experience because the logic state of some peripherals may be preserved during the enhanced power-saving mode. It may also allow a quicker wake-up than a standby mode because the logic state of some of the retained peripherals will not be lost during the enhanced power-saving mode. Further, an enhanced-power saving mode may lose less power due to leakage of its components because, in various embodiments, less internal peripherals may need leaky memory elements. An enhanced-power mode may also reduce software complexity.

An enhanced microcontroller 400 with an enhanced power-saving mode may also provide design flexibility for determining which peripherals may be retained and which ones are not retained. Peripherals may also be partitioned as a retained peripheral or a non-retained peripheral based on criteria for an enhanced microcontroller 400.

For example, in various embodiments, peripherals that are frequently used may be included in the retained-peripheral domain 407. Peripherals that consume small amounts of power may be included in the retained peripheral domain 407. In various embodiments, peripherals that need to be quickly restored after exiting the enhanced power-saving mode may be included in the retained-peripheral domain 407.

In various embodiments, peripherals that are infrequently used may be grouped in the non-retained peripheral domain 414. Peripherals that consume large amounts of power may be included in the non-retained peripheral domain 414. Peripherals that do not need to be quickly restored after exiting the enhanced power-saving mode, may be included into the non-retained peripheral domain 414. The peripherals of microcontroller 400 may be partitioned into the retained-peripheral domain 407 and the non-retained peripheral domain 414 to maximize power savings, user experience, or any other way desired.

In various embodiments, an enhanced microcontroller 400 may comprise an always-on domain 416. The always-on domain 416 may comprise an always on peripheral 416A. The always-on domain 416 may comprise additional peripherals. In some embodiments, an I2C peripheral may be included in the always-on domain 416. The peripherals or components of the always-on domain 416 may be configured to perform standard operations with a power source that is less than the high-power source provided by the main regulator 404. The peripherals or components of the always-on domain 416 may be configured to fully operate with the low-power source provided by the low-power regulator 412.

In various embodiments, the always-on domain 416 may be coupled to the low-power regulator 412 during the enhanced-power saving mode. The second switching arrangement 410 may couple the always-on domain 416 to the low-power regulator 412 during the enhanced power-saving mode. The second switching arrangement 410 may decouple the always-on domain from the low-power regulator 412 during the operational-power mode. The second switching arrangement 410 may decouple the always-on domain from the low-power regulator 412 during a standby mode of the enhanced microcontroller 400.

In various embodiments, the first switching arrangement 402 may couple the always-on domain 416 to the main regulator 404 during the operational-power mode. The first switching arrangement 402 may decouple the always-on domain from the main regulator 404 during an enhanced power-saving mode.

In various embodiments, the enhanced microcontroller 400 may comprise a power-mode controller 418 in communication with the first switching arrangement 402 and the second switching arrangement 410. The power-mode controller 418 may transmit control signals to the first switching arrangement 402 and the second switching arrangement 410. In various embodiments, the control signals transmitted to the first switching arrangement 402 may open and close the switch or switches in the first switching arrangement 402. In various embodiments, the control signals transmitted to the second switching arrangement 410 may open and close the switch or switches in the second switching arrangement 410.

In various embodiments of the enhanced microcontroller 400, a power-mode controller 418 may operate the first switching arrangement to couple the main regulator 404 to the retained-peripheral domain 407 and the non-retained peripheral domain 414 during an operational-power mode of the enhanced microcontroller 400. The power-mode controller 418 may be configured to operate the second switching arrangement 410 to couple the low-power regulator 412 to the retained-peripheral domain 407 during an enhanced power-saving mode. The power-mode controller 418 may be configured to operate the first switching arrangement 402 to decouple the retained-peripheral domain 407 and the non-retained peripherals of the non-retained peripheral domain 414 from the main regulator 404 during the enhanced power-saving mode.

In various embodiments, the power-mode controller 418 may also deliver control signals to operate the first switching arrangement 402 to couple and decouple the always-on domain 416 to and from the main regulator 404 during the operational-power mode and the enhanced power-saving mode. In various embodiments, the power-mode controller 418 may also deliver control signals to operate the second switching arrangement 410 to couple and decouple the low-power regulator 412 to and from the always-on domain 416 during the operational-power mode and the enhanced power-saving mode.

In various embodiments, the enhanced microcontroller 400 may also operate in a standby mode as described earlier in this disclosure. The power-mode controller 418 may transmit a control signal to the first switching arrangement 402 to operate the first switching arrangement 402 to decouple the main regulator 404 from the retained-peripheral domain 407 and the non-retained peripheral domain 414 during the standby mode. The power-mode controller 418 may transmit a signal to the second switching arrangement 410 to operate the second switching arrangement 410 to decouple the low-power regulator 412 from the retained-peripheral domain 407 during the standby mode. In various embodiments, the operation of the first switching arrangement 402 and the second switching arrangement 410 during the standby mode as operated by the power-mode controller 418, may also decouple the always-on domain 416 from the main regulator 404 and low-power regulator 412. In various embodiments, the enhanced microcontroller 400 may also operate in additional power-saving modes.

Figure 4A:
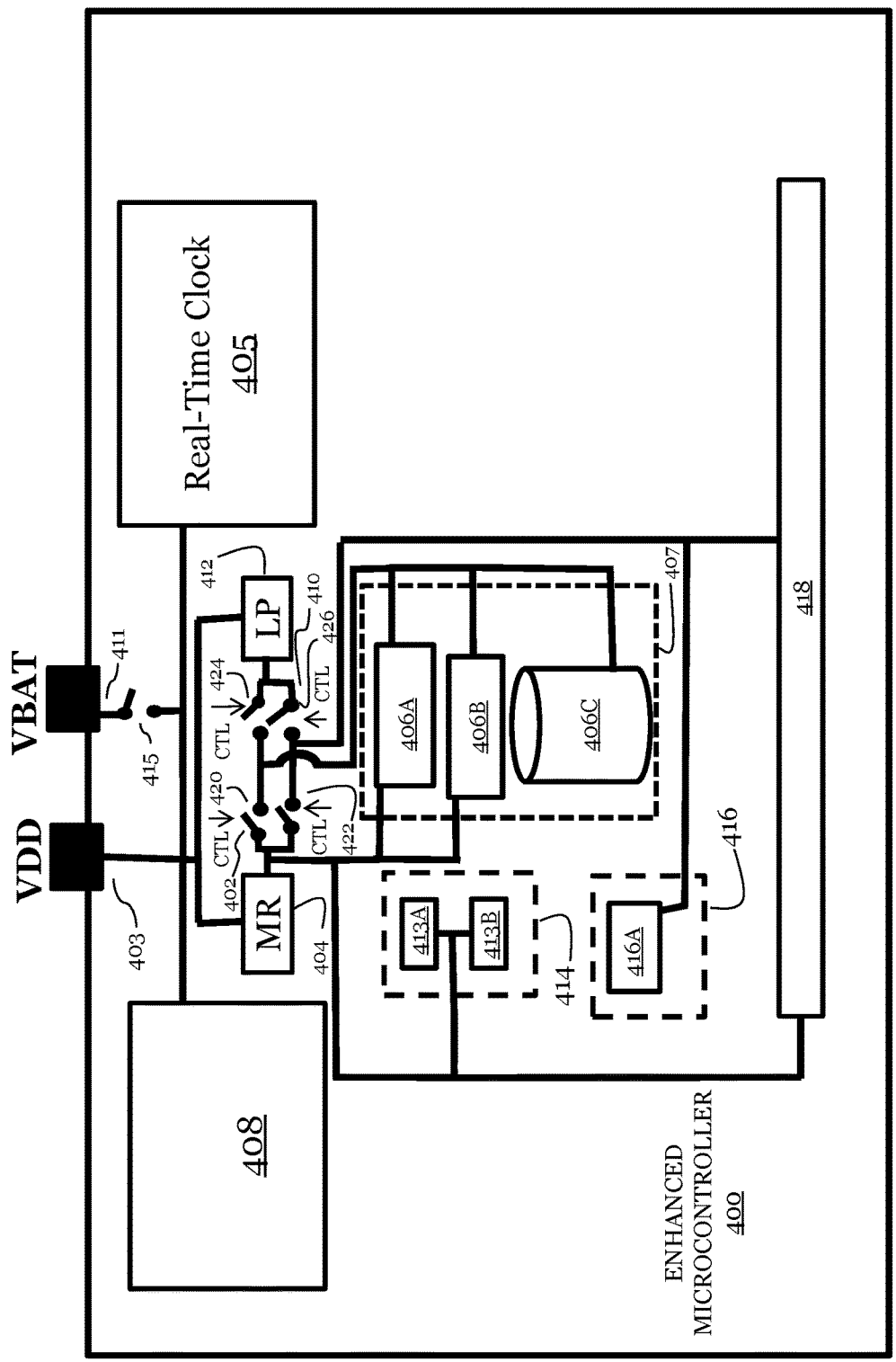
FIG. 4A illustrates an embodiment of an enhanced microcontroller.

FIG. 4A depicts an enhanced power controller.

In various embodiments of the enhanced microcontroller 400, the first switching arrangement 402 may comprise a first switch 420 and a second switch 422. The second switching arrangement 410 may comprise a first switch 424 and a second switch 426. The first switch 42o of the first switching arrangement 402, the second switch 422 of the first switching arrangement 402, the first switch 424 of the second switching arrangement 410, and the second switch 426 of the second switching arrangement may be opened and closed by control signals received from the power-mode controller 418.

In an enhanced power-saving mode of the enhanced microcontroller 400, the first switch 420 of the first switching arrangement 402 and the second switch 422 of the first switching arrangement 402 may be open. The first switch 424 of the second switching arrangement 410, and the second switch 426 of the second switching arrangement may be closed. In an operational-power mode of the enhanced microcontroller 400, the first switch 420 of the first switching arrangement 402 and the second switch 422 of the first switching arrangement 402 may be closed. The first switch 424 of the second switching arrangement 410, and the second switch 426 of the second switching arrangement may be open. In a standby mode of the enhanced microcontroller 400, the first switch 420 of the first switching arrangement 402 and the second switch 422 of the first switching arrangement 402 may be open. The first switch 424 of the second switching arrangement 410, and the second switch 426 of the second switching arrangement may also be open.

A first switching arrangement 402 comprising more than one switch and second switching arrangement 410 comprising more than one switch may allow the enhanced microcontroller 400 to select different domains to receive power in different modes of operation. For example, in an embodiment, the second switch 426 of the second switching arrangement 410 may be closed while the first switch 420 of the first switching arrangement 402, the second switch 422 of the first switching arrangement 402, and the first switch 424 of the second switching arrangement 410 are open. This may provide a low-power supply to the always-on domain 416 while no power is supplied to the retained-peripheral domain 407 and the non-retained peripheral domain 414.

The logic states of the retained peripherals of the retained-peripheral domain 407 may be set in a plurality of retention memory elements. And, in various embodiments, the logic state of the non-retained peripherals of the non-retained peripheral domain 414 may be set in a plurality of non-retention memory elements.

Figure 5:
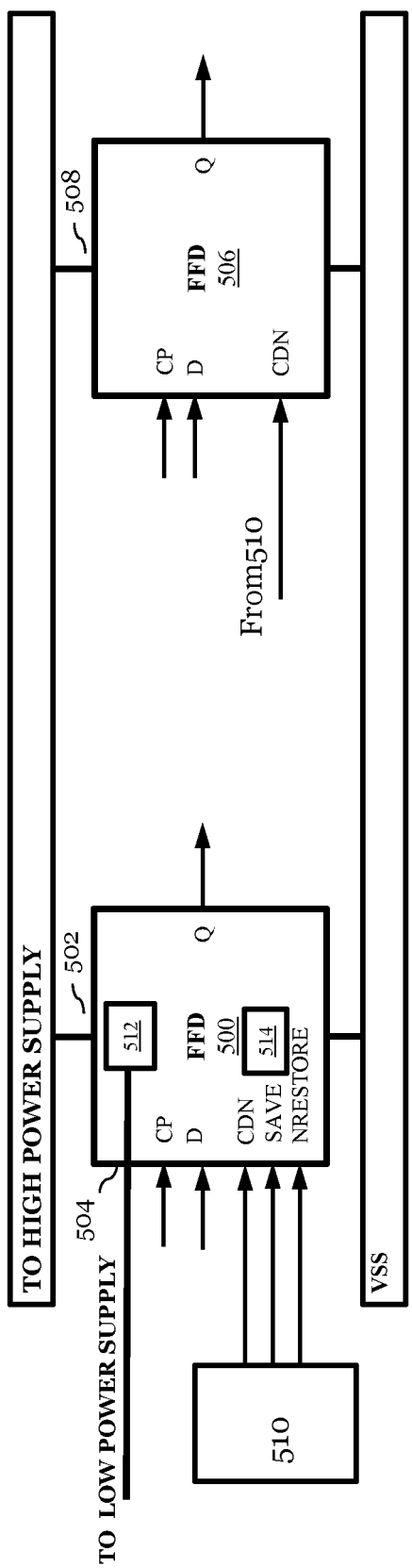
FIG. 5 illustrates an embodiment of a retention memory element and a non-retention memory element of an enhanced microcontroller.

FIG. 5 illustrates an embodiment of a retention memory element and a non-retention memory element of an enhanced microcontroller.

A retention memory element 500 may comprise a flip flop in various embodiments. Digital logic of the retention peripherals of the retained-peripheral domain 407 may be comprised of retention memory elements 500. A retention memory element 500 may comprise an input to receive a clock pulse CP. In various embodiments, the retention memory element 500 may comprise an input to receive a data value D. The retention memory element 500 may comprise an input to receive a reset signal CDN. In various embodiments, the retention memory element 500 may comprise an input to receive a save signal SAVE. The retention memory element 500 may comprise an input to receive a restore signal NRESTORE. In various embodiments, the retention memory element 500 may comprise an output Q. The retention memory element 500 element may also comprise a first power input 502. And, in various embodiments, the retention memory element may comprise a second power input 504.

A non-retention memory element 506 may comprise a flip flop in various embodiments. The non-retention memory element 506 may comprise an input to receive a clock pulse CP. The non-retention memory element 506 may comprise an input to receive a data value D. The non-retention memory element 506 may comprise an input to receive a reset signal CDN. In various embodiments, the non-retention memory element 506 may comprise an output Q. The non-retention memory element 506 may also comprise a power input 508.

In various embodiments, a retention memory element 500 may be configured to be set to a logic state of a corresponding retained peripheral of the retained-peripheral domain 407 during an operational-power mode of the enhanced microcontroller 400. The retention memory element 500 may function as a digital logic memory element of its corresponding retained peripheral during the operational-power mode of the enhanced microcontroller 400. In various embodiments, a retention memory element 500 may be set and re-set during the operational-power mode as the retained peripherals of the retained-peripheral domain 407 perform their respective functions. In various embodiments, the full digital logic complement of one or more retained peripherals of the retained-peripheral domain 407 may comprise retention memory elements 500.

In various embodiments, a retention memory element 500 may be configured to maintain the logic state of its corresponding retained peripheral during an enhanced power-saving mode of the enhanced microcontroller 400. In various embodiments, this may allow the logic states of the retained peripherals of the retained-peripheral domain 407 to be maintained during the enhanced power-saving mode of the enhanced microcontroller 400.

In various embodiments, a non-retention memory element 506 of an associated non-retained peripheral of the non-retained peripheral domain 414 may be configured to be set to a logic state of the non-retained peripheral during the operational-power mode of the enhanced microcontroller 400.

The non-retention memory element 506 may function as a digital logic memory element of its corresponding non-retained peripheral during the operational-power mode of the enhanced microcontroller 400. In various embodiments, a non-retention memory element 506 element may be set and re-set during the operational-power mode as the non-retained peripherals of the non-retained peripheral domain perform their respective functions. The full digital logic complement of one or more non-retained peripherals of the non-retained peripheral domain 414 may comprise non-retention memory elements 506.

In various embodiments, a controller 510 may be in communication with retention memory elements 500 of retained peripherals of the retained-peripheral domain 407 and the non-retention memory elements 506 of non-retained peripherals of the non-retained peripheral domain 414. The controller 510 may be referred to as a memory controller. The controller 510 may comprise a reset and clock controller. The controller 510 may deliver a save signal to one or more retention memory elements 500 that instructs the retention memory elements 500 to maintain logic states that have been set during the operational-power mode. The controller 510 may transmit the save signal before the enhanced microcontroller 400 enters the enhanced power-saving mode of the enhanced microcontroller 400. The save signal may be received at the input to receive a save signal SAVE of the retention memory element 500.

In various embodiments, the controller 510 may deliver a reset signal to non-retention memory elements 506 of non-retention peripherals of the non-retention domain to instruct the non-retention memory elements 506 to reset when the enhanced microcontroller 400 enters the enhanced power-saving mode. The reset signal may be received at the input to receive a reset signal CDN.

In various embodiments, a retention memory element 500 may be to be coupled to a high-power source during the operational-power mode of the enhanced microcontroller 400 and decoupled from the high-power source during the enhanced power-saving mode of the enhanced microcontroller 400. The retention memory element 500 may receive the high-power source at a first power input 502.

In various embodiments, a non-retention memory element 506 may be coupled to a high-power source during the operational-power mode of the enhanced microcontroller 400 and decoupled from the high-power source during an enhanced power-saving mode of the enhanced microcontroller 400. The retention memory element 500 may receive the high-power source at a power input 508.

In various embodiments, the retention memory element 500 may be coupled to a low-power source during the enhanced power-saving mode of the enhanced microcontroller 400 The retention memory element 500 may receive the low-power source at a second power input 504.

As described elsewhere, the enhanced microcontroller 400 may enter the enhanced power-saving mode, in various embodiments, when the high-power source delivered to the retained peripherals of the retained-peripheral domain 407 and the non-retained peripherals of the non-retained peripheral domain 414 is removed and the low-power source is delivered to the retained peripherals of the retained-peripheral domain 407. In various embodiments, the main regulator 404 may serve as the high-power source and the low-power regulator 412 may serve as the low-power source. The low power source and the high power source may be delivered to the retained peripherals, the non-retained peripherals, and the always-on peripherals by a bus, in various embodiments. In various embodiments, the enhanced microcontroller 400 may be triggered to enter the enhanced power-saving mode by user input or a triggering event such as a period of inactivity.

The retention memory element 500 and the non-retention memory element 506 may be coupled and to the main regulator 404, and thus the high-power source, by the first switching arrangement 402. In various embodiments, when the first switching arrangement 402 couples or decouples retained peripherals of the retained-peripheral domain 407 from the main regulator 404 retention memory elements 500 of the retained peripherals may also be coupled or decoupled from the main regulator 404. In various embodiments, when the first switching arrangement 402 couples or decouples non-retained peripherals of the non-retained peripheral domain 414 from the main regulator 404, the non-retention memory elements 506 of non-retention peripherals may also be coupled or decoupled from the main regulator 404.

The first switching arrangement 402 may comprise a single switch in various embodiments. In various embodiments, the first switching arrangement 402 may comprise an arrangement of switches that couple and decouple one or more retention memory elements 500 and one or more non-retention memory elements 506 from the high-power source.

Retention memory elements 500 may be coupled to the low-power regulator 412, and thus the low-power source, by the second switching arrangement 410. The second switching arrangement 410 may comprise a single switch in various embodiments. In various embodiments, the second switching arrangement 410 may comprise an arrangement of switches that couple and decouple one or more retention memory elements 500 from the low-power source. In various embodiments, when the second switching arrangement 410 couples or decouples retained peripherals of the retained-peripheral domain 407 from the low-power regulator 412 the retention memory elements 500 of the retained peripherals may also be coupled or decoupled from the low-power regulator 412.

In various embodiments of the enhanced microcontroller 400, the retention memory element 500 may comprise a low-power memory location 512 where a logic state of a retained peripheral may be maintained during the enhanced power-saving mode of the enhanced microcontroller 400. The low-power memory location 512 may comprise a balloon latch.

The low-power memory location 512 may be coupled to the low-power source, which may provide enough power to save the logic state of a retained peripheral. This may allow the retention memory element 500 to save a logic state of a peripheral while conserving power in the enhanced power-saving mode. In various embodiments, the logic state is saved in the low-power memory location 512 after the controller 510 transmits a save signal to the retention memory element 500.

In various embodiments of the enhanced microcontroller 400, a logic state of a retained peripheral of the retained-peripheral domain 407 stored in a retention memory element 500 may be set at a first memory location 514 of the retention memory element 500 during the operational-power mode of the enhanced microcontroller 400. In various embodiments, the first memory location 514 may require high-power delivered from the main regulator 404. The setting in the first memory location 514 may be lost when the enhanced microcontroller 400 enters the enhanced power-saving mode and the retention memory element 500 is decoupled from the main regulator 404.

In various embodiments, the controller 510 may transmit a restore signal to the retention memory element 500 before the enhanced microcontroller 400 exits the enhanced power-saving mode. This may be received by the retention memory element 500 at the input for the restore signal NRESTORE. This may occur in various embodiments after a wake-up event has triggered the enhanced microcontroller 400 to resume the operational-power mode. Once a restore signal has been received by a retention memory element 500, it may retrieve the logic state of the retained peripheral from the low-power memory location 512 and re-set the logic state of the retained peripheral to the first memory location 514.

In various embodiments, the enhanced microcontroller 400 may comprise an always-on memory. The always-on memory may store a flag that indicates when the microcontroller 400 is in the enhanced power-saving mode. In various embodiments, the always-on memory element may be coupled to the low-power regulator 412 during the enhanced power-saving mode of the microcontroller 400. This may allow the always-on memory element to be accessible during the enhanced power-saving mode. In various embodiments, the always-on memory element may be included in the always-on domain 416.

Figure 6:
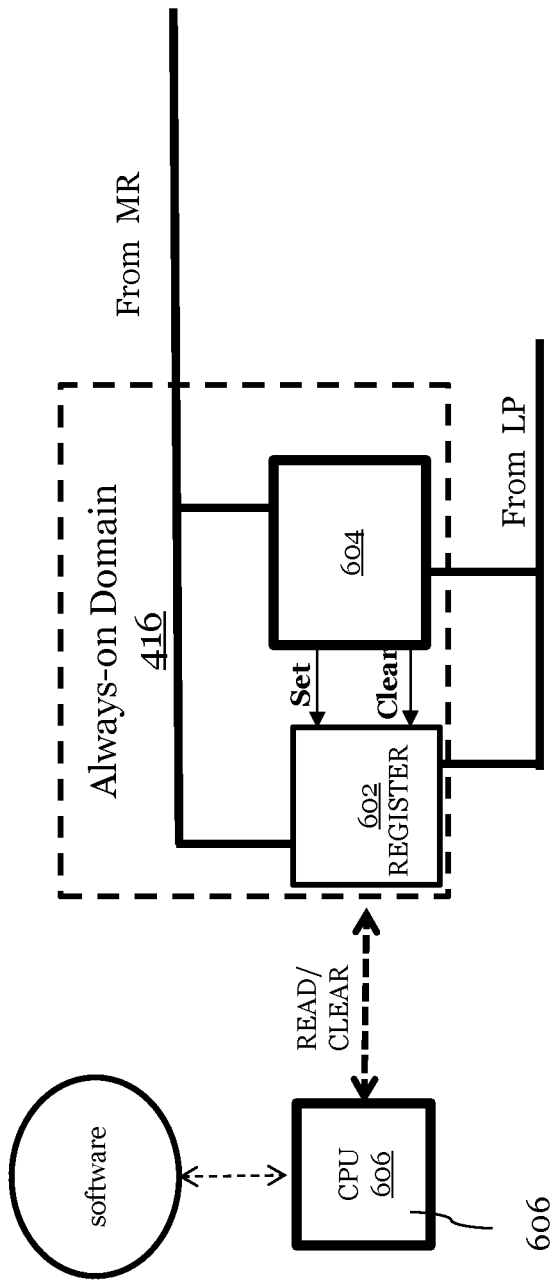
FIG. 6 illustrates an embodiment of the always-on memory element an always-on domain of an enhanced microcontroller.

FIG. 6 illustrates an embodiment of an always-on memory 602 in an always-on domain 416.

The always-on memory 602 may comprise a register. The always-on memory 602 may be in communication with power-control logic 604 also in the always-on domain 416. The always-on memory 602 may be set by the power-control logic 604 when the enhanced microcontroller 400 enters the enhanced power-saving mode. The always-on memory 602 may also be accessible by a CPU 606 that can retrieve the flag for processing.

In various embodiments, the power-mode controller 418 may comprise control elements in the always-on domain 416 and retained-peripheral domain 407 depending on their function. For example, control functions that control operations in the always-on domain 416 may also be in the always-on domain. Control functions that control operations in the retained-peripheral domain 407 may also be in the retained peripheral domain. The power-mode controller 418 may comprise power-control logic 604.

It may be advantageous to store a flag indicating whether the enhanced microcontroller 400 is in the enhanced power-saving mode so software applications can initialize the peripherals of the enhanced microcontroller 400 upon wake up. In various embodiments, the initialization procedure may vary for the retained peripherals of the retained-peripheral domain 407, whose state may have been saved during the enhanced power-saving mode, and non-retained peripherals of the non-retained peripheral domain 414 whose state may have been lost during the enhanced power-saving mode.

The always-on memory element and the power-control logic may be coupled to the low-power regulator 412 via the second switching arrangement 410 and the main regulator 404 via the first switching arrangement 402. In various embodiments, when the first switching arrangement 402 couples or decouples the always-on domain from the main regulator 404, the always-on memory 602 may also be coupled or decoupled from the main regulator 404. In various embodiments, when the second switching arrangement 410 couples or decouples the always-on domain 416 from the low-power regulator 412 the always-on memory 602 may also be coupled or decoupled from the low-power regulator 412.

Figure 7:
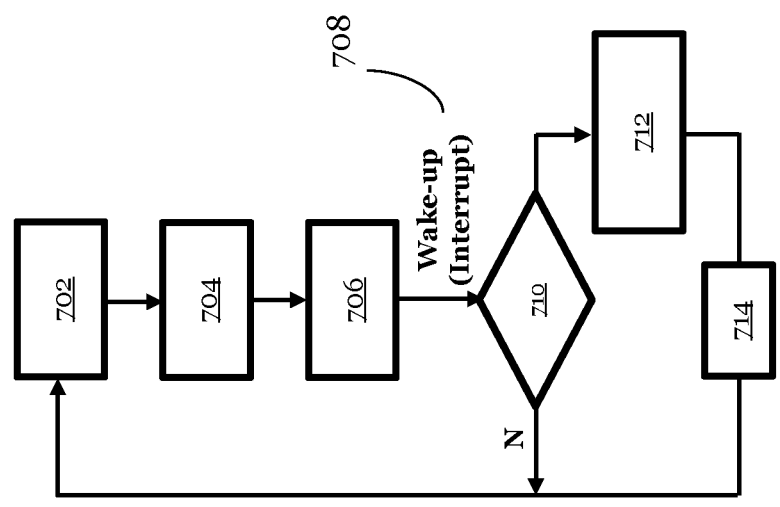
FIG. 7 depicts a flow chart illustrating a method for waking up an enhanced microcontroller in accordance with an embodiment.

FIG. 7 depicts a flow chart illustrating a method 700 for waking up an enhanced microcontroller 400.

At 702, the microcontroller 400 is operating in the operational-power mode. At a step 704, the enhanced power-saving mode is selected. This may be triggered by user input or some programmed condition such as a period of inactivity. At 706, the microcontroller 400 enters the enhanced power-saving mode. At 708, a wake-up event is detected. As will be appreciated, any number of various conditions may trigger a wake up such as user input or a timed operation.

At step 710, the flag is checked to determine whether the microcontroller 400 is in the enhanced power-saving mode or another power-saving mode such as a standby mode. If the flag indicates the microcontroller 400 is in the enhanced power-saving mode, the retained peripherals of the retained-peripheral domain 407 and non-retained peripherals of the non-retained peripheral domain 414 are initialized accordingly at step 712. The flag is cleared at step 714 and the system returned to the operational-power mode. If the flag indicates at 710 that the microcontroller 400 is not in the enhanced power-saving mode, steps 712 and 714 are skipped. The method 700 may be part of an Interrupt Service Routine (ISR) executed upon an interrupt event generated as a consequence of the wake up. The initialization from a standby mode may comprise a standard system initialization performed at each CPU boot.

Figure 8:
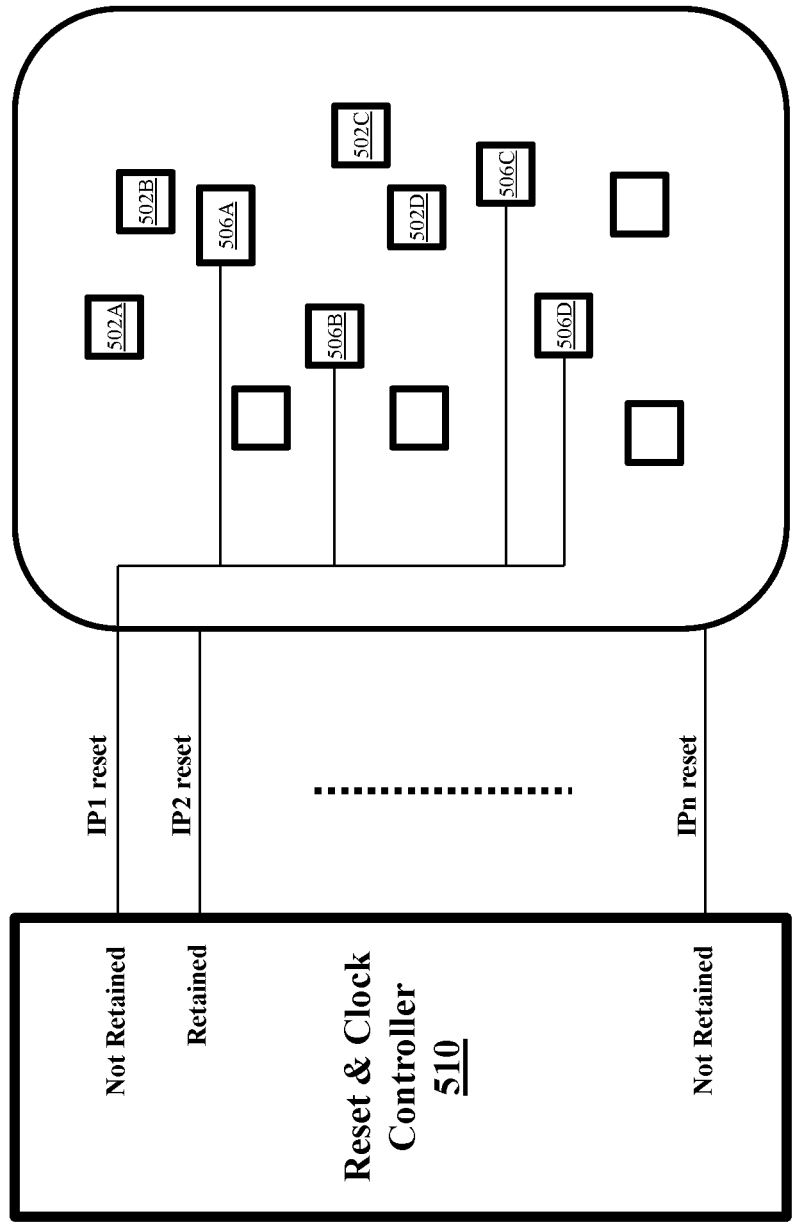
FIG. 8 illustrates a memory controller and memory elements.

FIG. 8 illustrates a controller 510, which may be referred to as a memory controller, and memory elements.

In various embodiments of the enhanced microcontroller 400, internal peripherals may be partitioned into retained peripherals and non-retained peripherals. During an operational-power mode of the microcontroller 400, the logic states of a first non-retained peripheral of the non-retained peripheral domain 414 may be stored in non-retention memory elements 506A, 506B, 506C, and 506D. In various embodiments, upon entering the enhanced power-saving mode, a controller 510 may deliver a reset signal IP1 to the non-retention memory elements 506A, 506B, 506C, and 506D of the first internal peripheral to reset the logic states stored therein. Upon entering the enhanced power-saving mode, the controller 510 may deliver a reset signal to non-retained memory elements of every non-retained peripheral of non-retained peripheral domain 414.

The logic states of a retained peripheral may be set in retention memory elements 502A, 502B, 502C and 502D. In various embodiments, controller 510 does not deliver a reset signal IP2 to the retention memory elements 502A, 502B, 502C and 502D because the logic state of the retained peripheral are saved in the enhanced-power saving mode and the logic states are not reset. The controller may deliver a save signal (not depicted in FIG. 8) to the retention memory elements 502A, 502B, 502C and 502D before the entering the enhanced power-saving mode and a restore signal (not depicted in FIG. 8) when leaving the enhanced power-saving mode. The controller 510 may also deliver the reset signal IP2 to retention memory elements 502A, 502B, 502C and 502D when the enhanced microcontroller 400 enters a standby mode.

In various embodiments, the controller 510 may selectively transmit the appropriate signal, which may be save, restore, or reset, to all the retained memory elements as determined by the mode of the enhanced microcontroller 400. The controller 510 may selectively transmit the appropriate signal, which may be save or reset, to all the non-retained memory elements as determined by the mode of the enhanced microcontroller 400.

In various embodiments, non-retention memory elements and retention memory elements may be located in physical proximity to each other. In various embodiments, non-retention memory elements and retention memory elements are not located in physical proximity to each other.

In various embodiments, the enhanced microcontroller 400 may operate in standby mode in addition to an operational-power mode and enhanced power-saving mode. In various embodiments, controller 510 may deliver a reset signal to retention memory elements and non-retention memory elements when the enhanced microcontroller 400 is entering the standby mode.

Figure 9:
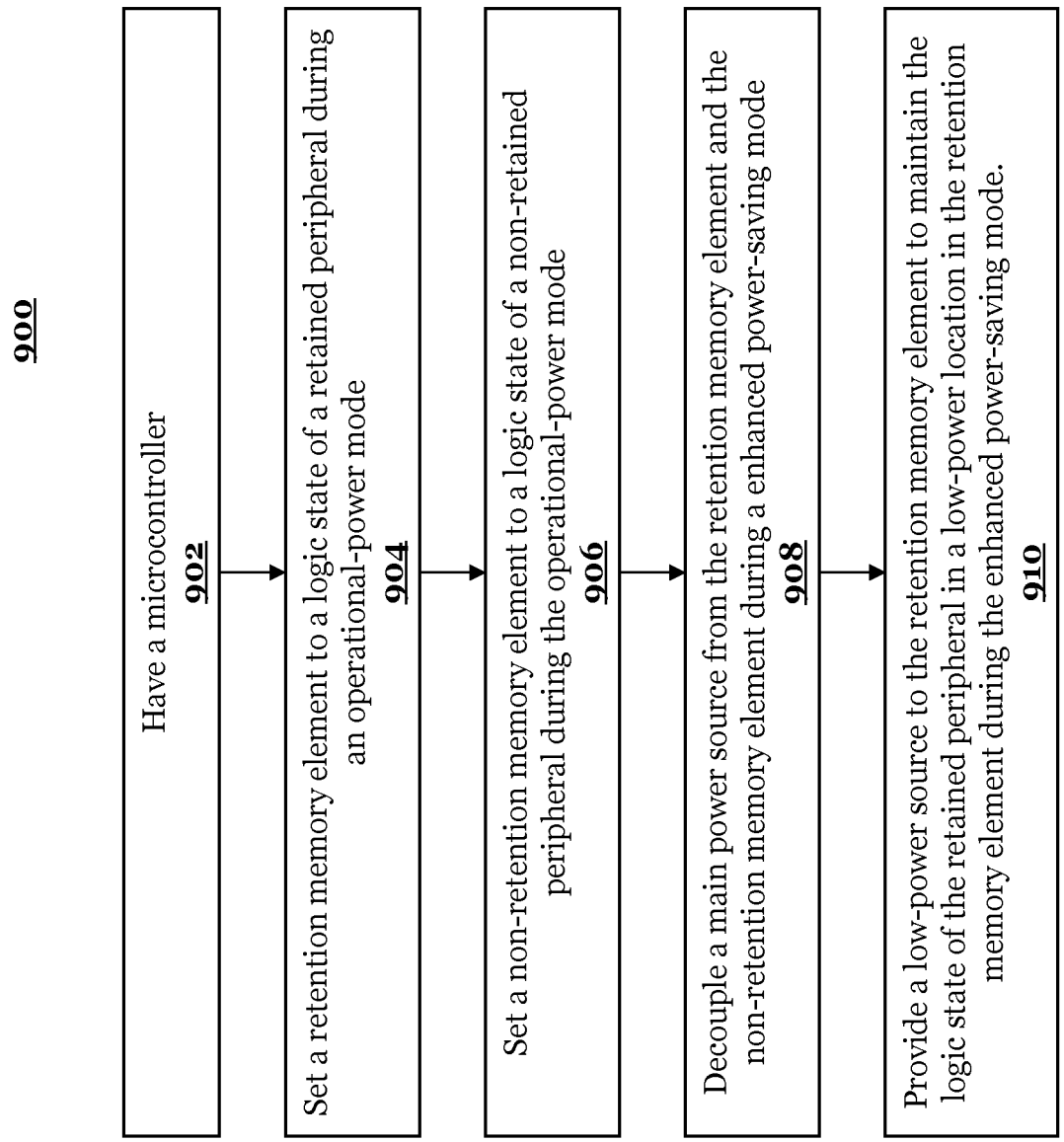
FIG. 9 depicts a flow chart illustrating a method to conserver power in accordance with an embodiment.

FIG. 9 depicts a flow chart illustrating a method 900 to conserver power in accordance with an embodiment.

At a step 902, the method 900 to conserve power may comprise having a microcontroller. At a step setting 904, the method 900 may further comprise setting a retention memory element to a logic state of a retained peripheral during an operational-power mode. In various embodiments, the method 900 may comprise at a step 906, setting a non-retention memory element to a logic state of a non-retained peripheral during the operational-power mode. The method 900 may further comprise at a step 908 decoupling a main power source from the retention memory element and the non-retention memory element during an enhanced power-saving mode. The method 900 may further comprise at a step 910 providing a low-power source to the retention memory element to maintain the logic state of the retained peripheral in a low-power location of the retention memory element during the enhanced power-saving mode.

In various embodiments, the method 900 further comprises restoring the main power source to the retention memory element and the non-retention memory element when the enhanced power-saving mode expires.

In various embodiments, the method 900 further comprises wherein the retention memory element loses its setting during the enhanced power-saving mode and wherein the method 900 further comprises restoring the setting of the retention memory element from the low-power location.

In various embodiments, the method 900 further comprises decoupling the main power source from the retention memory element and the non-retention memory element during a second power-saving mode.

In various embodiments, the method 900 further comprises indicating when the microcontroller is in the enhanced power-saving mode by saving a flag into a flagging memory element wherein the flagging memory element is coupled to the low-power source during the enhanced power-saving mode.

Example 1

A power-saving system including a retention flip flop of a retained peripheral; a non-retention flip flop of a non-retained peripheral; and a controller in communication with the retention flip flop and the non-retention flip flop, where the controller is configured to deliver a save signal to the retention flip flop to instruct the retention flip flop to maintain a logic state of the retained peripheral during an enhanced power-saving mode of the power-saving system and to deliver a reset signal to the non-retention flip flop to instruct the non-retention flip flop to reset the non-retention flip flop when the power-saving system enters the enhanced power-saving mode of the power-saving system.

Example 2

The power-saving system of example 1, where the retention flip flop is configured to be coupled to a high-power source during an operational-power mode of the power-saving system and decoupled from the high-power source during the enhanced power-saving mode of the power-saving system; the non-retention flip flop is configured to be coupled to the high-power source during the operational-power mode of the power-saving system and decoupled from the high-power source during the enhanced power-saving mode of the power-saving system; and the retention flip flop is configured to be coupled to a low-power source during the enhanced power-saving mode of the power-saving system.

Example 3

The power-saving system of examples 1 or 2, where the retention flip flop includes a balloon latch where the logic state of the retained peripheral is maintained during the enhanced power-saving mode of the power-saving system.

Example 4

The power-saving system of examples 1 to 3, where the logic state of the retained peripheral is set in the retention flip flop at a first memory location of the retention flip flop during the operational-power mode of the power-saving system that is lost when the power-saving system enters the enhanced power-saving mode of the power-saving system and where the controller is configured to deliver a restore signal to the retention flip flop to instruct the retention flip flop to retrieve the logic state of the retained peripheral from the balloon latch to re-set the logic state of the retained peripheral to the first memory location when the power-saving system leaves the enhanced power-saving mode.

Example 5

The power-saving system of examples 1 to 4, where the balloon latch is configured to be coupled to the low-power source during the enhanced power-saving mode of the power-saving system to power the balloon latch during the enhanced power-saving mode of the power-saving system.

Example 6

The power-saving system of examples 1 to 5, where the low-power source provides power to the balloon latch to maintain the logic state of the retained peripheral during the enhanced power-saving mode of the power-saving system.

Example 7

The power-saving system of examples 1 to 6, where the retention flip flop is coupled to the high-power source during the operational-power mode of the power-saving system by a first switch and coupled to the low-power source by a second switch during the enhanced power-saving mode of the power-saving system.

Example 8

The power-saving system examples 1 to 7, where the non-retention flip flop is coupled to the high-power source during the operational-power mode of the power-saving system by the first switch.

Example 9

The power-saving system of examples 1 to 8, further including an always-on memory that is configured to be coupled to the low-power source during the enhanced power-saving mode of the power-saving system to store a flag indicating when the power-saving system is in the enhanced power-saving mode of the power-saving system.

Example 10

The power-saving system of examples 1 to 9, where the retention flip flop is configured to be decoupled from the high-power source and the low-power source during a second power-saving mode of the power-saving system and where the non-retention flip flop is configured to be decoupled from the high-power source during the second power-saving mode of the power-saving system.

Example 11

A microcontroller including a main-power regulator coupled to a principal voltage supply and configured to provide a main power; a low-power regulator coupled to the principal voltage supply and configured to provide a low power, a first switching arrangement configured to couple and decouple the main-power regulator to a retention flip flop and a non-retention flip flop; a second switching arrangement configured to couple and decouple the low-power regulator to the retention flip flop; a power-mode controller in communication with the first switching arrangement and the second switching arrangement and configured to operate the first switching arrangement to couple the main-power regulator to the retention flip flop and the non-retention flip flop during an operational-power mode; and where the power-mode controller is configured to operate the second switching arrangement to couple the low-power regulator to the retention flip flop during an enhanced power-saving mode and operate the first switching arrangement to decouple the retention flip flop and the non-retention flip flop from the main-power regulator during the enhanced power-saving mode.

Example 12

The microcontroller of example 11, where the power-mode controller is configured to operate the first switching arrangement to decouple the main-power regulator from the retention flip flop and the non-retention flip flop during a second power-saving mode and operate the second switching arrangement to decouple the low-power regulator from the retention flip flop in the second power-saving mode.

Example 13

The microcontroller of examples 11 or 12, where the first switching arrangement includes a first switch including: a first end coupled to the main-power regulator; and a second end coupled to the retention flip flop and coupled to the non-retention flip flop.

Example 14

The microcontroller of examples 11 to 13, where the second switching arrangement includes a second switch including a first end coupled to the low-power regulator; and a second end coupled to the retention flip flop.

Example 15

The microcontroller of examples 11 to 14, further including an always-on memory that is configured to be coupled to the low-power regulator during the enhanced power-saving mode to store a flag indicating when the microcontroller is in the enhanced power-saving mode.

Example 16

The microcontroller of examples 11 to 15, further including a memory controller in communication with the retention flip flop and the non-retention flip flop where the memory controller is configured to deliver a save signal to the retention flip flop to instruct the retention flip flop to maintain a logic state of a retained peripheral during the enhanced power-saving mode and to deliver a reset signal to the non-retention flip flop to instruct the non-retention flip flop to reset the non-retention flip flop when the microcontroller enters the enhanced power-saving mode.

Example 17

The microcontroller of examples 11 to 16, where the retention flip flop includes a balloon latch where the logic state of the retained peripheral is maintained during the enhanced power-saving mode.

Example 18

The microcontroller of examples 11 to 17, where the logic state of the retained peripheral is set in the retention flip flop at a first memory location of the retention flip flop during the operational-power mode that is lost when the microcontroller enters the enhanced power-saving mode and where the memory controller is configured to deliver a restore signal to the retention flip flop to retrieve the logic state of the retained peripheral from the balloon latch to re-set the logic state of the retained peripheral to the first memory location when the microcontroller leaves the enhanced power-saving mode.

Example 19

The microcontroller examples 11 to 18, where the balloon latch is configured to be coupled to the low-power regulator during the enhanced power-saving mode to supply power to the balloon latch during the enhanced power-saving mode.

Example 20

A method to conserve power including: having a microcontroller; setting a retention flip flop to a logic state of a retained peripheral during an operational-power mode; setting a non-retention flip flop to a logic state of a non-retained peripheral during the operational-power mode; decoupling a main power source from the retention flip flop and the non-retention flip flop during an enhanced power-saving mode; and providing a low-power source to the retention flip flop to maintain the logic state of the retained peripheral in a low-power location of the retention flip flop during the enhanced power-saving mode.

Example 21

The method to conserve power of example 20, further including restoring the main power source to the retention flip flop and the non-retention flip flop when the enhanced power-saving mode expires.

Example 22

The method to conserve power of examples 20 or 21, where the retention flip flop loses its setting during the enhanced power-saving mode and where the method further including restoring the setting of the retention flip flop from the low-power location.

Example 23

The method to conserve power of examples 20 to 22, further including, decoupling the main power source from the retention flip flop and the non-retention flip flop during a second power-saving mode.

Example 24

The method to conserve power of examples 20 to 23, further including indicating when the microcontroller is in the enhanced power-saving mode by saving a flag into a flagging memory element, where the flagging memory element is coupled to the low-power source during the enhanced power-saving mode.

Example 25

The method to conserve power of examples 20 to 24, further including determining the microcontroller is in the enhanced power-saving mode when: the main power source is decoupled from the retention flip flop and the non-retention flip flop; and the low-power source is provided to the retention flip flop.

References to illustrative embodiments in this description are not intended to be construed in a limiting sense. Various modifications and combinations of the illustrative embodiments, as well as other embodiments will be apparent to persons skilled in the art upon reference to the description. It is therefore intended that the appended claims encompass any such modifications or embodiments.

What is claimed is:

1. A power-saving system comprising:
a retention flip flop of a retained peripheral;
a non-retention flip flop of a non-retained peripheral;
a controller in communication with the retention flip flop and the non-retention flip flop, wherein the controller is configured to deliver a save signal to the retention flip flop to instruct the retention flip flop to maintain a logic state of the retained peripheral during an enhanced power-saving mode of the power-saving system, and the controller is configured to deliver a reset signal to the non-retention flip flop to instruct the non-retention flip flop to reset the non-retention flip flop when the power-saving system enters the enhanced power-saving mode of the power-saving system from an operational-power mode of the power-saving system, and wherein the retention flip flop is configured to be powered by a first voltage generated by a main-power regulator during the operational-power mode and powered by a second voltage generated by a low-power regulator during the enhanced power-saving mode, wherein the first voltage is higher than the second voltage; and
a full-power peripheral, wherein the retained peripheral and the non-retained peripheral are configured to be powered off in a standby mode of the power-saving system, wherein the full-power peripheral is configured to be powered by a supply voltage in the standby mode, the operational-power mode, and the enhanced power-saving mode, wherein the supply voltage is an input voltage to the main-power regulator and the low-power regulator, and is used for powering the main-power regulator and the low-power regulator, wherein the supply voltage remains at a same voltage value during the operational-power mode, the enhanced power-saving mode, and the standby mode.

2. The power-saving system of claim 1, wherein:
the retention flip flop is configured to be decoupled from the main-power regulator during the enhanced power-saving mode of the power-saving system; and
the non-retention flip flop is configured to be coupled to the main-power regulator during the operational-power mode of the power-saving system and decoupled from the main-power regulator during the enhanced power-saving mode of the power-saving system.

3. The power-saving system of claim 2, wherein the retention flip flop comprises:
a balloon latch where the logic state of the retained peripheral is maintained during the enhanced power-saving mode of the power-saving system.

4. The power-saving system of claim 3, wherein the logic state of the retained peripheral is set in the retention flip flop at a first memory location of the retention flip flop during the operational-power mode of the power-saving system that is lost when the power-saving system enters the enhanced power-saving mode of the power-saving system and wherein the controller is configured to deliver a restore signal to the retention flip flop to instruct the retention flip flop to retrieve the logic state of the retained peripheral from the balloon latch to re-set the logic state of the retained peripheral to the first memory location when the power-saving system leaves the enhanced power-saving mode.

5. The power-saving system of claim 2, wherein the retention flip flop is coupled to the main-power regulator during the operational-power mode of the power-saving system by a first switch and coupled to the low-power regulator by a second switch during the enhanced power-saving mode of the power-saving system.

6. The power-saving system of claim 5, wherein the non-retention flip flop is coupled to the main-power regulator during the operational-power mode of the power-saving system by the first switch.

7. The power-saving system of claim 2, further comprising an always-on memory that is configured to be powered by the second voltage provided by the low-power regulator during the enhanced power-saving mode of the power-saving system to store a flag indicating when the power-saving system is in the enhanced power-saving mode of the power-saving system.

8. A microcontroller comprising:
a main-power regulator powered by a principal voltage supply and configured to provide a first voltage;
a low-power regulator powered by the principal voltage supply and configured to provide a second voltage lower than the first voltage, wherein the second voltage has a constant voltage value;
a first switching arrangement configured to couple and decouple the main-power regulator to a retention flip flop and a non-retention flip flop, wherein the retention flip flop is in a retained peripheral of the microcontroller and the non-retention flip flop is in a non-retained peripheral of the microcontroller, wherein the retained peripheral and the non-retained peripheral operate to perform normal operation of the microcontroller during an operational-power mode of the microcontroller;
a second switching arrangement configured to couple and decouple the low-power regulator to the retention flip flop;
a power-mode controller in communication with the first switching arrangement and the second switching arrangement and configured to operate the first switching arrangement to couple the main-power regulator to the retention flip flop and the non-retention flip flop during the operational-power mode, wherein the power-mode controller is configured to operate the second switching arrangement to couple the low-power regulator to the retention flip flop during an enhanced power-saving mode of the microcontroller and operate the first switching arrangement to decouple the retention flip flop and the non-retention flip flop from the main-power regulator during the enhanced power-saving mode, wherein the non-retention flip flop is configured to be decoupled from the low-power regulator during the enhanced power-saving mode, wherein the retention flip flop is powered by the first voltage during the operational-power mode and is powered by the second voltage during the enhanced power-saving mode; and
a full-power peripheral, wherein the full-power peripheral is powered by the principal voltage supply in the operational-power mode and the enhanced power-saving mode, wherein the power-mode controller is configured to operate the first switching arrangement and the second switch arrangement such that in a standby mode of the microcontroller, the retention peripheral and the non-retention peripheral are powered off, and the full-power peripheral is powered by the principal voltage supply, wherein the principal voltage supply provides a same voltage during the operational-power mode, the enhanced power-saving mode, and the standby mode.

9. The microcontroller of claim 8, further comprising an always-on memory that is configured to be coupled to the low-power regulator during the enhanced power-saving mode to store a flag indicating when the microcontroller is in the enhanced power-saving mode.

10. The microcontroller of claim 8, further comprising:
a memory controller in communication with the retention flip flop and the non-retention flip flop wherein the memory controller is configured to deliver a save signal to the retention flip flop to instruct the retention flip flop to maintain a logic state of the retained peripheral during the enhanced power-saving mode and to deliver a reset signal to the non-retention flip flop to instruct the non-retention flip flop to reset the non-retention flip flop when the microcontroller enters the enhanced power-saving mode.

11. The microcontroller of claim 10, wherein the retention flip flop comprises:
a balloon latch where the logic state of the retained peripheral is maintained during the enhanced power-saving mode.

12. The microcontroller of claim 11, wherein the logic state of the retained peripheral is set in the retention flip flop at a first memory location of the retention flip flop during the operational-power mode that is lost when the microcontroller enters the enhanced power-saving mode and wherein the memory controller is configured to deliver a restore signal to the retention flip flop to retrieve the logic state of the retained peripheral from the balloon latch to re-set the logic state of the retained peripheral to the first memory location when the microcontroller leaves the enhanced power-saving mode.

13. A method to conserve power of a microcontroller, the method comprising:
setting a retention flip flop of a retained peripheral of the microcontroller to a logic state of the retained peripheral during an operational-power mode;
setting a non-retention flip flop of a non-retained peripheral of the microcontroller to a logic state of the non-retained peripheral during the operational-power mode, wherein the retained peripheral and the non-retained peripheral operate to perform normal function of the microcontroller in the operational-power mode, wherein the retention flip flop and the non-retention flip flop are powered by a first voltage provided by a main-power regulator during the operational-power mode;
decoupling the main-power regulator from the retention flip flop and the non-retention flip flop during an enhanced power-saving mode;
powering the retention flip flop by a second voltage provided by a low-power regulator to maintain the logic state of the retained peripheral in a low-power location of the retention flip flop during the enhanced power-saving mode, wherein the second voltage is lower than the first voltage;
powering off the retained peripheral and the non-retained peripheral by decoupling the main-power regulator and the low-power regulator from the retained peripheral and the non-retained peripheral during a standby mode; and
powering a full-power peripheral of the microcontroller with a supply voltage in the standby mode, the operational-power mode, and the enhanced-power saving mode, wherein the supply voltage has a same voltage value in the standby mode, the operational-power mode, and the enhanced-power saving mode, wherein the main-power regulator and the low-power regulator are configured to be powered by the supply voltage and convert the supply voltage into the first voltage and the second voltage, respectively.

14. The method to conserve power of claim 13, further comprising re-connecting the main-power regulator to the retention flip flop and the non-retention flip flop when the enhanced power-saving mode expires.

15. The method to conserve power of claim 13, further comprising restoring the logic state of the retained peripheral from the low-power location of the retention flip flop when the microcontroller exits the enhanced power-saving mode.

16. The method to conserve power of claim 13, further comprising indicating when the microcontroller is in the enhanced power-saving mode by saving a flag into a flagging memory element, wherein the flagging memory element is coupled to the low-power regulator during the enhanced power-saving mode.

17. The method to conserve power of claim 13, further comprising determining the microcontroller is in the enhanced power-saving mode when:
   the main-power regulator is decoupled from the retention flip flop and the non-retention flip flop; and
   the low-power regulator is coupled to the retention flip flop.

18. The power-saving system of claim 1, further comprising an always-on peripheral, wherein the always-on peripheral is configured to be powered by the first voltage provided by the main-power regulator during the operational-power mode and configured to be powered by the second voltage provided by the low-power regulator during the enhanced power-saving mode, wherein the always-on peripheral is configured to fully operate when powered by either the first voltage or the second voltage.

19. The power-saving system of claim 18, wherein the always-on peripheral includes an I2C peripheral.

20. The microcontroller of claim 8, further comprising an always-on peripheral, wherein the power-mode controller is configured to operate the first switching arrangement and the second switch arrangement such that the always-on peripheral is powered by the first voltage provided by the main-power regulator during the operational-power mode and is powered by the second voltage provided by the low-power regulator during the enhanced power-saving mode, wherein the second voltage is lower than the first voltage, wherein the always-on peripheral is configured to be fully functional when powered by the first voltage or the second voltage.

21. The power-saving system of claim 1, wherein there is no overlap among circuits of the full-power peripheral, circuits of the retained peripheral, and circuits of the non-retained peripheral.

22. The power-saving system of claim 1, wherein the supply voltage has a different voltage value from the first voltage and the second voltage.

23. The microcontroller of claim 8, wherein the full-power peripheral, the retained peripheral, and the non-retained peripheral comprise non-overlapping circuits.

24. The microcontroller of claim 23, wherein the principal voltage supply has a different voltage value from the first voltage and the second voltage.

25. The method to conserve power of claim 13, wherein the full-power peripheral, the retained peripheral, and the non-retained peripheral comprise non-overlapping circuits, and the supply voltage is different from the first voltage and the second voltage.

* * * * *